US009659898B1

(12) United States Patent
Railkar et al.

(10) Patent No.: US 9,659,898 B1
(45) Date of Patent: May 23, 2017

(54) APPARATUSES, SYSTEMS, AND METHODS FOR DIE ATTACH COATINGS FOR SEMICONDUCTOR PACKAGES

(71) Applicant: TriQuint Semiconductor, Inc., Hillsboro, OR (US)

(72) Inventors: Tarak A. Railkar, Plano, TX (US); Kevin J. Anderson, Plano, TX (US); Walid Meliane, Frisco, TX (US); John M. Beall, Richardson, TX (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 14/603,261

(22) Filed: Jan. 22, 2015

Related U.S. Application Data (60) Provisional application No. 62/100,433, filed on Jan. 6, 2015.

(51) Int. Cl.
*H01L 27/14* (2006.01)
*H01L 23/00* (2006.01)
*H01L 23/29* (2006.01)
*H01L 21/56* (2006.01)

(52) U.S. Cl.
CPC .............. *H01L 24/32* (2013.01); *H01L 21/56* (2013.01); *H01L 23/293* (2013.01); *H01L 24/83* (2013.01); *H01L 2924/01047* (2013.01); *H01L 2924/186* (2013.01)

(58) Field of Classification Search
CPC ............ H01L 2924/00; H01L 2224/97; H01L 2224/48091; H01L 2924/00014; H01L 2224/73265; H01L 924/15311; H01L 24/32; H01L 21/56; H01L 23/293; H01L 24/83; H01L 2924/01047; H01L 2924/186
USPC ....................................... 257/428
See application file for complete search history.

(56) References Cited

U.S. PATENT DOCUMENTS

| | | | |
|---|---|---|---|
| 6,545,332 B2 * | 4/2003 | Huang | 257/433 |
| 6,734,567 B2 * | 5/2004 | Chiu | H01L 21/563 257/688 |
| 8,237,260 B2 * | 8/2012 | Tschirbs | H01L 23/13 257/684 |
| 9,099,567 B2 * | 8/2015 | Viswanathan | H01L 24/83 |
| 2008/0001282 A1 * | 1/2008 | Modi | H01L 21/563 257/710 |
| 2012/0225623 A1 * | 9/2012 | Gu | 455/63.1 |
| 2014/0070397 A1 * | 3/2014 | Viswanathan et al. | 257/706 |
| 2014/0103510 A1 * | 4/2014 | Andou | H01L 23/49551 257/676 |

OTHER PUBLICATIONS

Mei, Y. et al., "Migration of Sintered Nanosilver Die-Attach Material on Alumina Substrate Between 250° C. and 400° C. in Dry Air," IEEE Transactions on Device and Materials Reliability, vol. 11, No. 2, Jun. 2011, pp. 316-322.
Matthew, Sony et al., "Tin Whiskers: How to Mitigate and Manage the Risks," Proceedings of HDP'07, 2007, IEEE, 8 pages.

* cited by examiner

*Primary Examiner* — Xinning Niu
*Assistant Examiner* — Vu A Vu
(74) *Attorney, Agent, or Firm* — Withrow & Terranova, P.L.L.C.

(57) ABSTRACT

Embodiments of the present disclosure are directed towards apparatuses, systems, and methods for die attach coatings for semiconductor packages. In one embodiment, a die may be coupled with a substrate by a die attach and a coating may be applied to an edge of the die attach.

19 Claims, 7 Drawing Sheets

APPARATUSES, SYSTEMS, AND METHODS FOR DIE ATTACH COATINGS FOR SEMICONDUCTOR PACKAGES

CROSS-REFERENCE TO RELATED APPLICATION

The present application is a non-provisional application of and claims priority to U.S. Provisional Patent Application No. 62/100,433, filed Jan. 6, 2015, entitled "APPARATUSES, SYSTEMS, AND METHODS FOR DIE ATTACH COATINGS FOR SEMICONDUCTOR PACKAGE," the disclosure of which is hereby incorporated by reference in its entirety for all purposes except for those sections, if any, that are inconsistent with this specification.

FIELD

Embodiments of the present disclosure generally relate to the field of semiconductor packages, and more particularly, to die attach coatings used in such semiconductor packages.

BACKGROUND

Semiconductor packages may include a die coupled with a substrate by a die attach. While some of the materials and configurations used in these semiconductor packages may be selected for desirable operating characteristics, they may also be associated with various challenges.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

In the following detailed description, reference is made to the accompanying drawings that form a part hereof wherein like numerals designate like parts throughout, and in which is shown by way of illustration embodiments in which the invention may be practiced. It is to be understood that other embodiments may be utilized and structural or logical changes may be made without departing from the scope of the present invention. Therefore, the following detailed description is not to be taken in a limiting sense, and the scope of embodiments in accordance with the present invention is defined by the appended claims and their equivalents.

Various operations may be described as multiple discrete operations in turn, in a manner that may be helpful in understanding embodiments of the present invention; however, the order of description should not be construed to imply that these operations are order dependent. Moreover, some embodiments may include more or fewer operations than may be described.

The description may use the phrases "in an embodiment," "in embodiments," "in some embodiments," or "in various embodiments," which may each refer to one or more of the same or different embodiments. Furthermore, the terms "comprising," "including," "having," and the like, as used with respect to embodiments of the present invention, are synonymous.

As used herein, "coupled," along with its derivatives, may mean one or more of the following. "Coupled" may mean a direct physical or electrical coupling or connection, wherein there is no other element coupled or connected between the elements that are said to be coupled with each other. "Coupled" may also mean an indirect physical or electrical coupling or connection, where one or more other elements are coupled or connected between the elements that are said to be coupled with each other.

The description may use perspective-based descriptions such as up/down, back/front, and top/bottom. Such descriptions are merely used to facilitate the discussion and are not intended to restrict the application of embodiments of the present invention.

For the purposes of the present disclosure, the term "or" is used as an inclusive term to mean at least one of the components coupled with the term. For example, the phrase "A or B" means (A), (B), or (A and B); and the phrase "A, B, or C" means (A), (B), (C), (A and B), (A and C), (B and C), or (A, B, and C).

Figure 1:
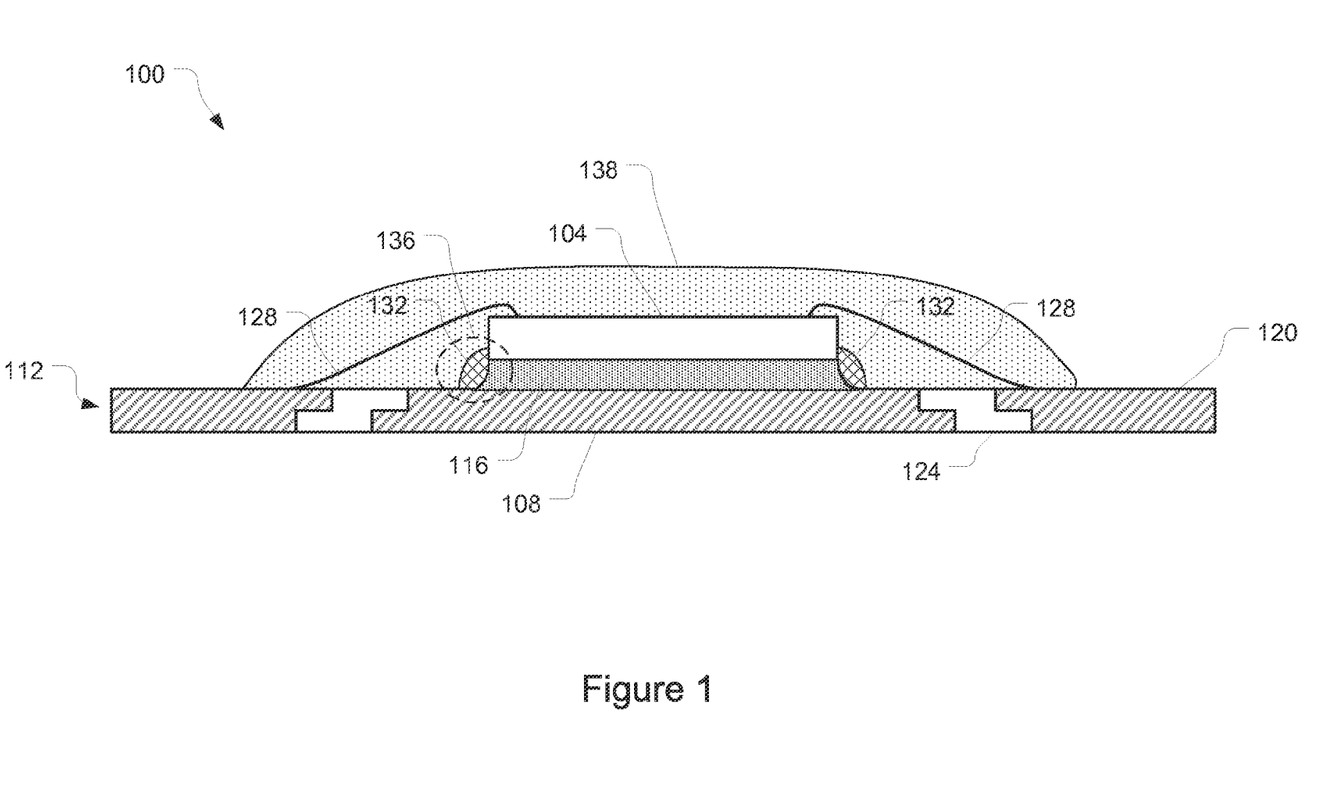
FIG. 1 is a cross-sectional side view of a package in accordance with some embodiments.

FIG. 1 is a cross-sectional side view of a package 100 in accordance with various embodiments.

The package 100 may include a die 104 coupled with a top surface of a die pad 108 of a substrate 112. The die 104 may be coupled with the die pad 108 of the substrate 112 by a die attach 116. As the die pad 108 may be a ground pad for the package 100, in various embodiments, the die attach 116 may comprise a conductive material, for example, silver (Ag), to provide an electrical pathway between the die 104 and the die pad 108 of the substrate 112. The die attach 116 may also provide a thermal pathway between the die 104 and the die pad 108, which may also provide heat dissipation for the package 100.

The substrate 112 may comprise a leadframe including the die pad 108 and a plurality of leads 120 around the periphery of the die pad 108 as illustrated. The die pad 108 and the leads 120 may be electrically insulated from each other by an insulating material 124, for example, liquid-crystal polymer, plastic, epoxy, etc. In various embodiments, the substrate 112 may comprise any suitable material including, for example, pre-plated nickel, palladium, gold, etc.

Various electrical connections may be provided between the die 104 and the leads 120 by wires 128. The leads 120 may, in turn, provide electrical access to the die 104.

As discussed above, the die attach 116 may include silver which may be sintered to facilitate the attach process. Sintered silver (s-Ag) may be a desired die attach material for high-power or high-frequency applications due to its high thermal conductivity, ease of manufacturability, and relatively low cost. However, sintered silver may also provide challenges in certain applications. For example, in situations in which sintered silver is exposed to ambient air, it may exhibit dendrite formation or whisker growth that could be detrimental to device performance and reliability. Unchecked, the dendrites or whiskers may grow to the point that they cause short circuits within the package 100. Accordingly, embodiments of the present invention further include a coating 132 applied to an edge of the die attach layer. Covering the edge of the die attach 116 with the coating 132 may prevent, or at least inhibit, dendrite formation or whisker growth.

The coating 132 may be an organic or inorganic material such as an epoxy, a resin, an acrylic, a silicone, etc. The material of the coating 132 may be selected to facilitate the use of standard assembly materials and devices for application of the coating 132. The material of the coating 132 may also be selected to provide desirable adhesion to sintered silver and to inhibit dendrite formation or whisker growth.

Figure 2:
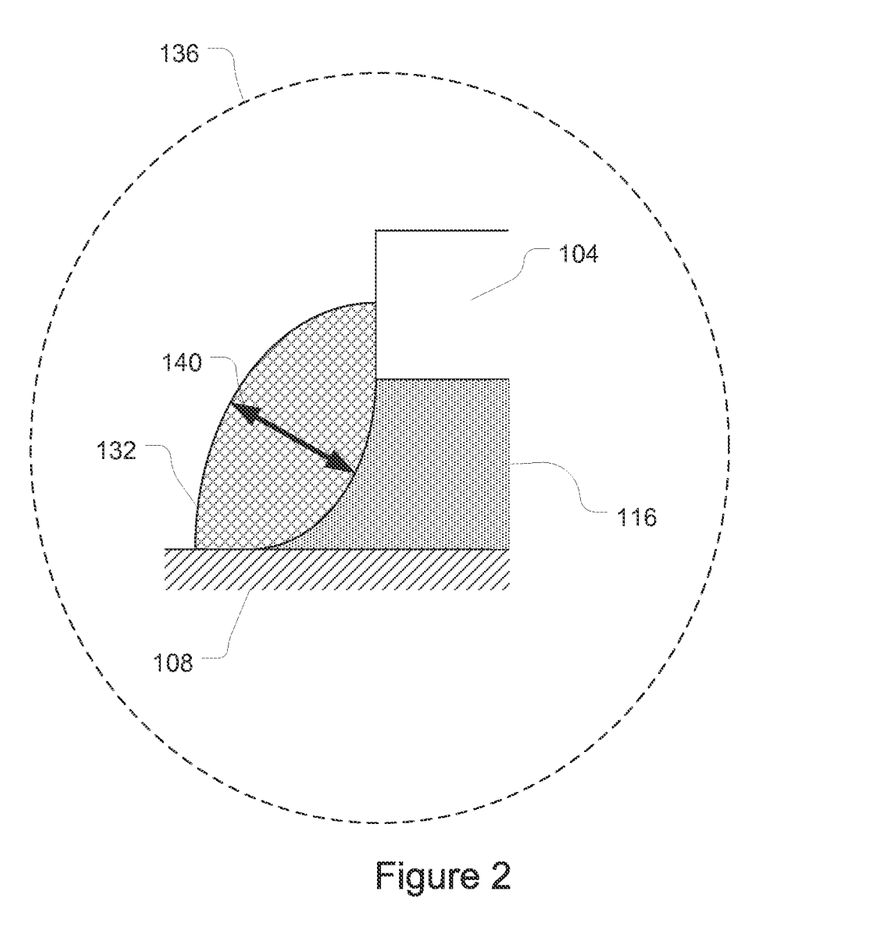
FIG. 2 is an exploded view of a callout shown in FIG. 1 in accordance with some embodiments.

FIG. 2 is an exploded view of callout 136 shown in FIG. 1 in accordance with some embodiments. As can be seen, the coating 132 may encompass a fillet formed by the die attach 116. The coating 132 may cover a portion of a side of the die 104 and may further cover a portion of the top surface of the die pad 108 of the substrate 112. It may be further noted that the coating 132 does not cover a top surface of the die 104. This may allow the wires 128 to be exposed to a gaseous environment, as described below with respect to air-cavity packages, or, in some embodiments, encompassed by an overmold material 138 as shown.

The dimension and shape of the coating 132 as shown in the figures is for illustrative purposes only and need not be to scale. In other embodiments, the coating 132 may include other dimensions or shapes and may cover more or less than specifically shown.

In embodiments in which a coating 132 is used to cover edge portions of the die attach 116 and the overmold material 138 is used to encompass the top surface of the die 104, each of these materials may be selected based on the desired objectives. For example, a material that adheres well to sintered silver may be selected for the coating 132, while a material that provides excellent electrical isolation may be selected for the overmold material 138.

In various embodiments, the overmold material 138 may be composed of any of a number of suitable materials such as, but not limited to, an epoxy, a resin, an acrylic, a silicone, etc.

In various embodiments, the coating 132 may have a thickness 140. The thickness 140 may be measured substantially orthogonal to the die attach 116. The thickness 140 may be sufficient to prevent dendrites or whiskers from breaking through the coating 132. In some embodiments, the thickness 140 may be greater than approximately 20 mils.

Figure 3:
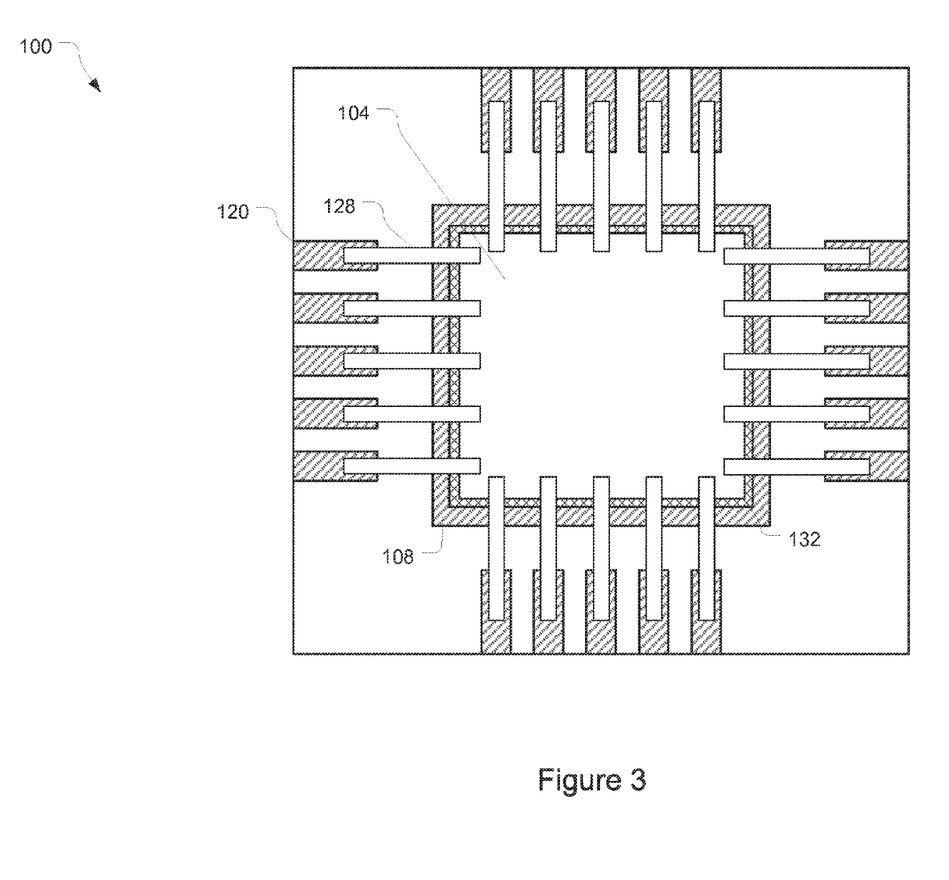
FIG. 3 is a top view of the package shown in FIG. 1 in accordance with some embodiments.

FIG. 3 is a top view of the package 100, without the overmold material 138, in accordance with some embodiments. As can be seen, the coating 132 may be disposed around a complete periphery of the die attach 116. In such an embodiment, the coating 132, die 104, and substrate 112 may fully encompass the die attach 116. In other embodiments, the coating 132 may be disposed only in areas in which dendrite formation or whisker growth may be problematic. In such embodiments, portions of the edges of the die attach 116 may be exposed to ambient air, or at least not covered by the coating 132.

Figure 4:
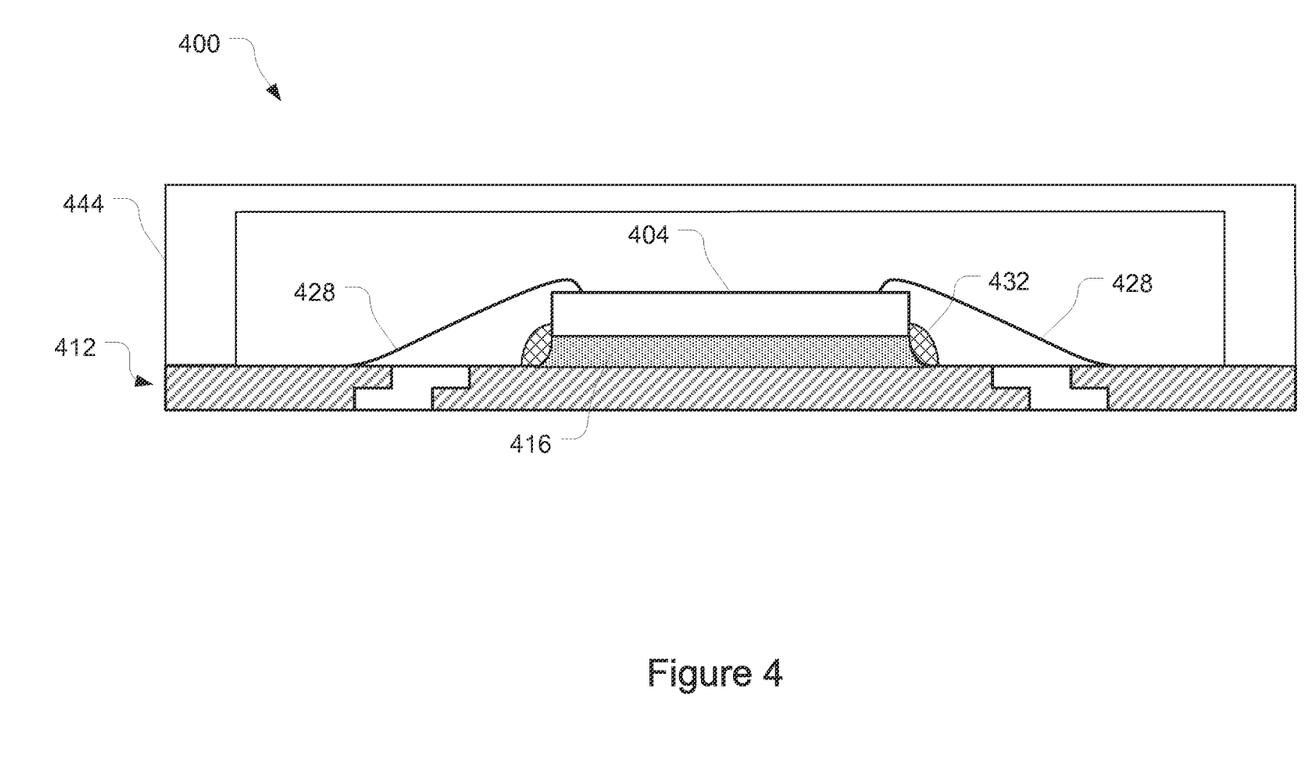
FIG. 4 is a cross-sectional side view of another package in accordance with some embodiments.
Figure 5A:
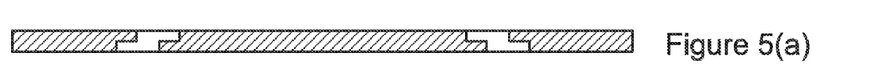
FIGS. 5(a)-5(f) illustrate various phases of making a package in accordance with some embodiments.
Figure 5B:
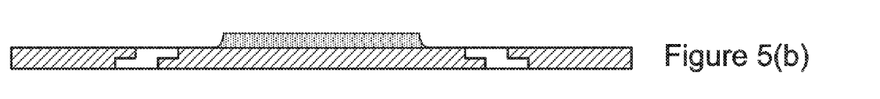
Figure 5C:
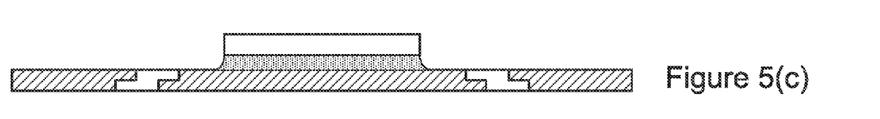
Figure 5D:
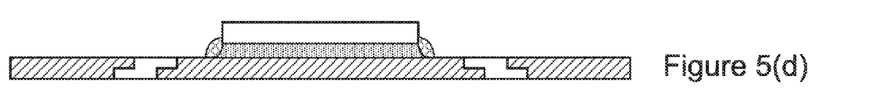
Figure 5E:
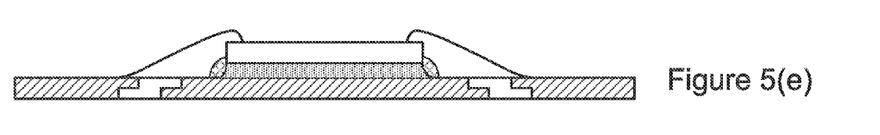
Figure 5F:
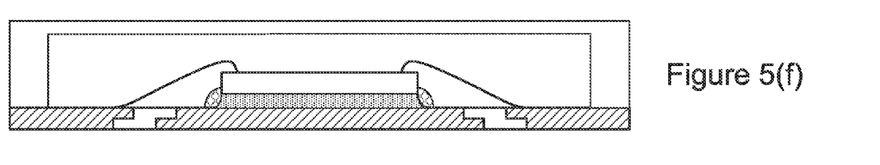

FIG. 4 is a cross-sectional side view of a package 400 in accordance with some embodiments. Similar to the package 100, the package 400 may include a die 404 coupled with a substrate 412 by a die attach 416, which may be composed of sintered silver. The die 404 may be electrically coupled with the substrate 412 by wires 428. Further, a coating 432 may be applied to edges of the die attach 416.

However, the package 400 may not include an overmold material. Instead, the package 400 may include an enclosure 444 coupled with the substrate 412 to form an cavity within which the die 404 is disposed. In some embodiments, the package 400 may be referred to as an air-cavity package. The enclosure 444 may be composed of polymer (for example, a liquid crystal polymer), ceramic, laminate materials, etc.

While embodiments may refer to the package 400 as an air-cavity package, the cavity may enclose a gaseous environment that includes any combination of gases. For example, in some embodiments, the cavity may be filled with ambient air (Nitrogen, Oxygen, Argon, etc.) or selected inert gases. Additionally, the cavity may be at atmospheric pressure or it may be a partial vacuum.

The top surface of the die 404 and the wires 428 may be exposed to the gaseous environment within the cavity. The cavity of the package 400 may provide several operational advantages. For example, the cavity may be advantageous in that the gaseous environment has a lower dielectric constant than that found for overmold materials. Thus, utilizing the cavity may result in a reduced dielectric loading as compared to an overmolded package.

While the cavity may provide benefits, certain challenges may arise through use of a cavity when, for example, using sintered silver as the material for the die attach 416. When sintered silver is exposed to air or moisture, the risk for dendrite formation or whisker growth may increase. Therefore, providing the coating 432 over the edge of the die attach 416, yet leaving the top surface of the die 404 and wires 428 exposed to the gaseous environment inside the cavity, may provide the reduced dielectric loading and may limit the dendrite formation or whisker growth that may otherwise occur when using sintered silver in an air-cavity package. In such a manner, the package may improve both the device performance as well as its reliability.

Figure 6:
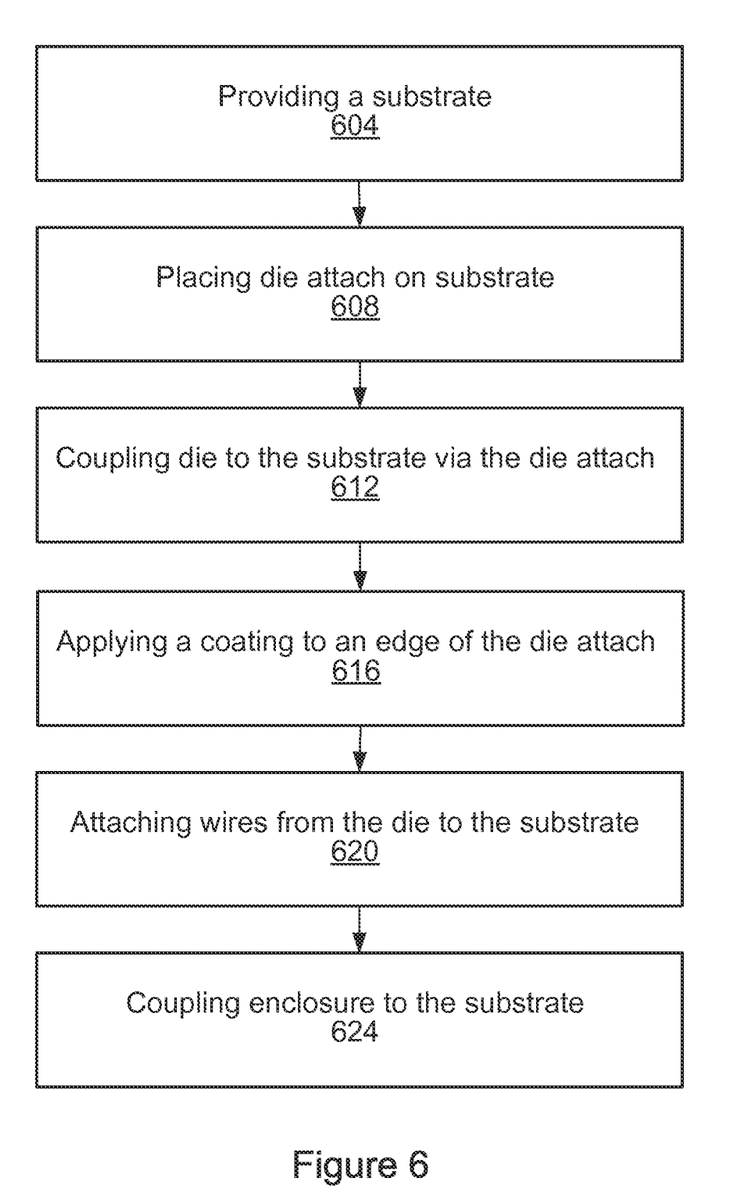
FIG. 6 is a flowchart of a method of making a package in accordance with some embodiments.

FIGS. 5(*a*)-5(*f*) illustrate various phases of making a package such as package 400 in accordance with some embodiments. FIG. 6 is a flow diagram that describes operations associated with a method 600 of making a package in accordance with some embodiments. The operations of the method 600 may respectively correspond to the phases of FIGS. 5(*a*)-5(*f*). Although the method 600 is illustrated as a series of sequential steps, the method 600 is not necessarily order dependent. Some operations may be done in a different order than that presented. Further, methods within the scope of this disclosure may include more or fewer operations than those illustrated in FIG. 6.

At 604, the method 600 may include providing a substrate such as shown in FIG. 5(*a*), for example. The substrate may comprise a leadframe. The leadframe may include a die pad and leads in accordance with various embodiments described herein. In various embodiments, the substrate may be a ceramic, metal, or laminate-based substrate. In some embodiments, the substrate may be a quad flat no-leads (QFN) package substrate. In other embodiments, other types of substrates may be used.

At 608, the method 600 may include placing a die attach on the substrate as shown in FIG. 5(*b*), for example. The die attach may be placed in a pattern on a first surface of the substrate. In some embodiments, the die attach may be placed by depositing sintered silver on the die pads of the substrate.

At 612, the method 600 may include coupling a die to the substrate via the die attach as shown in FIG. 5(*c*), for example. The die may be composed of a material such as silicon, gallium arsenide, gallium nitride, or other appropriate semiconductor materials.

At 616, the method 600 may include applying a coating to an edge of the die attach as shown in FIG. 5(*d*), for example. In some embodiments, the coating may be applied by using a needle to dispense the coating material at the appropriate locations. In some embodiments, the coating may be applied by other methods such as, but not limited to, stencil printing, manual application, etc.

At 620, the method 600 may include attaching wires from the die to leads of the substrate as shown in FIG. 5(*e*), for example. The attaching of the wires from the die to the substrate may electrically couple the die to the substrate. The attachment of the wires may include soldering the wires to contact points on a top surface of the die and corresponding contact points on the leads of the substrate.

At 624, the method 600 may include coupling an enclosure with the substrate as shown in FIG. 5(*f*), for example. The coupling of the enclosure with the substrate may form a cavity within which the die is disposed. In some embodiments the enclosure may be single molded piece that is coupled with the substrate by an adhesive applied between the enclosure and the substrate. In other embodiments, the enclosure may be coupled with the substrate in a series of operations. For example, in some embodiments, walls of the enclosure may be formed first followed by formation of a cap that is coupled with the walls. In some embodiments, coupling of the enclosure to the substrate may provide a hermetically sealed cavity.

While the method 600 describes the making of a single package, it will be understood that some embodiments include making a plurality of packages. For example, operations 608, 612, 616, 620, and 624 may be done with respect to a plurality of dice that are disposed on a common substrate. After formation of the packages, or in the process of the formation of the packages, individual packages may be separated from one another.

Figure 7:
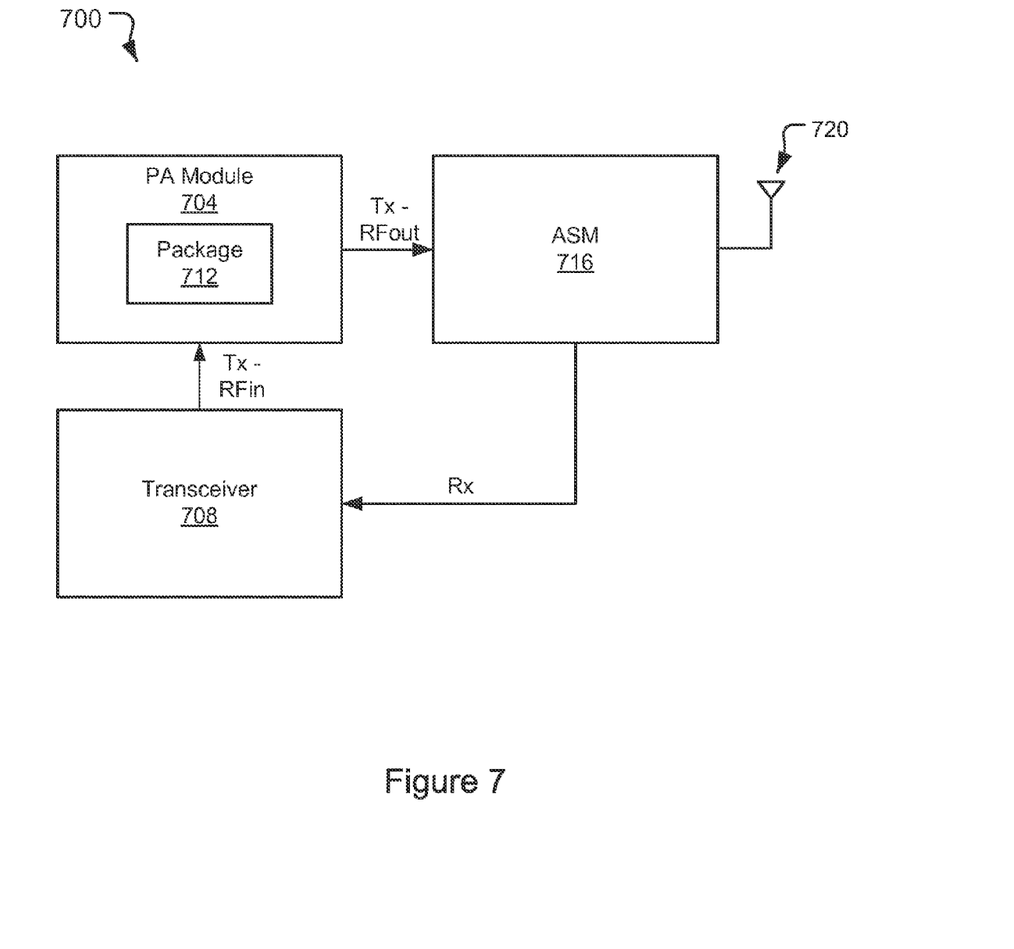
FIG. 7 is a schematic illustration of an example system in accordance with some embodiments.

Embodiments of packages described herein, and apparatuses including such packages, may be incorporated into various other apparatuses and systems. A block diagram of an example system 700 is illustrated in FIG. 7. As illustrated, the system 700 includes a radio frequency (RF) power amplifier module 704. The system 700 may include a transceiver 708 coupled with the RF power amplifier module 704 as illustrated.

The power amplifier module 704 may include a package 712. The package 712 may be similar to package 100 or package 400 described herein in which a die is coupled with a top surface of a substrate via a die attach and a coating is applied to an edge of the die attach.

The RF power amplifier module 704 may receive an RF input signal, RFin, from the transceiver 708. The RF power amplifier module 704 may amplify the RF input signal, RFin, to provide the RF output signal, RFout. The RF input signal, RFin, and the RF output signal, RFout, may both be part of a transmit (Tx) chain, respectively noted by Tx-RFin and Tx-RFout in FIG. 7.

The amplified RF output signal, RFout, may be provided to an antenna switch module (ASM) 716, which effectuates an over-the-air (OTA) transmission of the RF output signal, RFout, via an antenna structure 720. The ASM 716 may also receive RF signals via the antenna structure 720 and couple the received RF signals, Rx, to the transceiver 708 along a receive chain.

In various embodiments, the antenna structure 720 may include one or more directional and/or omnidirectional antennas, including, e.g., a dipole antenna, a monopole antenna, a patch antenna, a loop antenna, a microstrip antenna or any other type of antenna suitable for OTA transmission/reception of RF signals.

The system 700 may be any system including power amplification. In various embodiments, the system 700 may be particularly useful for power amplification at high radio frequency power and frequency. For example, the system 700 may be suitable for any one or more of terrestrial and satellite communications, radar systems, and possibly in various industrial and medical applications. More specifically, in various embodiments, the system 700 may be a selected one of a radar device, a satellite communication device, a mobile handset, a cellular telephone base station, a broadcast radio, or a television amplifier system.

Various examples of embodiments of the present disclosure are provided below.

Example 1 includes a package comprising: a substrate; a die coupled with the substrate by a die attach that includes sintered silver; a coating applied to an edge of the die attach; and an enclosure coupled with the substrate to form a cavity within which the die is disposed.

Example 2 includes the package of example 1, wherein the coating comprises an epoxy.

Example 3 includes the package of any of examples 1-2, wherein the coating, die, and substrate fully encompass the die attach.

Example 4 includes the package of any of examples 1-2, wherein a portion of the die attach is exposed to a gaseous environment.

Example 5 includes the package of any of examples 1-4, wherein the coating has a thickness greater than approximately 20 mils.

Example 6 includes an apparatus comprising: a substrate; a die having a first surface coupled with the substrate by a die attach that includes silver; and a coating applied to an edge of the die attach and not to a second surface of the die, which is opposite the first surface.

Example 7 includes the apparatus of example 6, further comprising: an enclosure coupled with the substrate to form a cavity within which the die is disposed.

Example 8 includes the apparatus of example 6, wherein the coating comprises an epoxy and has a thickness greater than approximately 20 mils.

Example 9 includes the apparatus of any of examples 6-8, wherein the coating, die, and substrate fully encompass the die attach.

Example 10 includes the apparatus of any of examples 6-9, wherein the die attach comprises a fillet and the coating encompasses the fillet.

Example 11 includes the apparatus of any of examples 6-10, wherein a portion of the die attach is exposed to a gaseous environment.

Example 12 includes the apparatus of any of examples 6-11, further comprising an overmold material disposed over the second surface of the die.

Example 13 includes a method comprising: coupling a die to a substrate using a die attach that includes sintered silver; applying a coating to an edge of the die attach; and coupling an enclosure to the substrate to form a cavity within which the die is disposed.

Example 14 includes the method of example 13, wherein the coating is an epoxy.

Example 15 includes the method of any of examples 13-14, further comprising attaching wires from the die to the substrate to electrically couple the die to the substrate.

Example 16 includes the method of any of examples 13-15, wherein said applying of the coating comprises: using a needle to dispense the coating at the edge of the die attach.

Example 17 includes a system comprising: an antenna switch module configured to receive radio frequency (RF) output signals; a transceiver coupled with the antenna switch module and configured to generate RF input signals; and a power amplifier module coupled with the antenna switch module and the transceiver, and configured to receive the RF input signals from the transceiver and to provide RF output signals to the antenna switch module, wherein the power amplifier module includes: a substrate; a die coupled with a top surface of the substrate with a die attach; a coating applied to an edge of the die attach; and an enclosure coupled with the substrate to form a cavity within which the die is disposed.

Example 18 includes the system of example 17, wherein the coating is an epoxy that is disposed around a complete periphery of the die attach.

Example 19 includes the system of any of examples 17-18, wherein the coating is an epoxy that is disposed at a first portion of the edge of the die attach and a second portion of the edge of the die attach is exposed.

Example 20 includes the system of any of examples 17-19, wherein the system is a radar device, a satellite communication device, a mobile handset, a base station, a broadcast radio, or a television amplifier system.

Although the present disclosure has been described in terms of the above-illustrated embodiments, it will be appreciated by those of ordinary skill in the art that a wide variety of alternate and/or equivalent implementations calculated to achieve the same purposes may be substituted for the embodiments shown and described without departing from the scope of the present disclosure. Those with skill in the art will readily appreciate that embodiments in accordance with the present disclosure may be implemented in a very wide variety of embodiments. This description is intended to be regarded as illustrative instead of restrictive.

What is claimed is:

1. A package comprising:
   a substrate;
   a die having opposite first and second surfaces, wherein the first surface is coupled with the substrate by a die attach that includes sintered silver;
   a coating applied to an edge of the die attach to at least inhibit dendrite formation or whisker growth of the die attach, wherein:
      the coating and the die attach are formed from different materials; and
      the coating contacts a portion of the substrate but does not contact the second surface of the die;
   at least one wire extending from the second surface of the die to the substrate; and
   an enclosure coupled with the substrate to form a cavity within which the die is disposed, wherein the at least one wire does not contact the coating and is exposed to a gaseous environment within the cavity.

2. The package of claim 1, wherein the coating comprises an epoxy.

3. The package of claim 1, wherein the coating, die, and substrate fully encompass the die attach.

4. The package of claim 1, wherein a portion of the die attach is exposed to a gaseous environment.

5. The package of claim 1, wherein the coating has a thickness greater than approximately 20 mils.

6. An apparatus comprising:
   a substrate;
   a die having opposite first and second surfaces, wherein the first surface is coupled with the substrate by a die attach that includes sintered silver;
   at least one wire extending from the second surface of the die to the substrate; and
   a coating applied to an edge of the die attach to at least inhibit dendrite formation or whisker growth of the die attach, wherein:
      the coating and the die attach are formed from different materials; and
      the coating contacts a portion of the substrate but does not contact the at least one wire and the second surface of the die.

7. The apparatus of claim 6, further comprising:
   an enclosure coupled with the substrate to form a cavity within which the die is disposed, wherein the at least one wire is exposed to a gaseous environment within the cavity.

8. The apparatus of claim 6, wherein the coating comprises an epoxy and has a thickness greater than approximately 20 mils.

9. The apparatus of claim 6, wherein the coating, die, and substrate fully encompass the die attach.

10. The apparatus of claim 6, wherein the die attach comprises a fillet and the coating encompasses the fillet.

11. The apparatus of claim 6, wherein a portion of the die attach is exposed to a gaseous environment.

12. The apparatus of claim 6, further comprising an overmold material disposed over the second surface of the die.

13. A method comprising:
   coupling a first surface of a die to a substrate using a die attach that includes sintered silver;
   applying a coating to an edge of the die attach to at least inhibit dendrite formation or whisker growth of the die attach, wherein the coating and the die attach are formed from different materials, and the coating contacts a portion of the substrate;
   attaching at least one wire from a second surface of the die to the substrate to electrically couple the die to the substrate, wherein the second surface of the die is opposite the first surface of the die; and
   coupling an enclosure to the substrate to form a cavity within which the die is disposed, wherein the coating does not contact the at least one wire and the second surface of the die such that the at least one wire is exposed to a gaseous environment within the cavity.

14. The method of claim 13, wherein the coating is an epoxy.

15. The method of claim 13, wherein said applying of the coating comprises:
   using a needle to dispense the coating at the edge of the die attach.

16. A system comprising:
   an antenna switch module configured to receive radio frequency (RF) output signals;
   a transceiver coupled with the antenna switch module and configured to generate RF input signals; and
   a power amplifier module coupled with the antenna switch module and the transceiver, and configured to receive the RF input signals from the transceiver and to provide RF output signals to the antenna switch module, wherein the power amplifier module includes:
      a substrate;

a die having opposite first and second surfaces, wherein the first surface is coupled with a top surface of the substrate by a die attach;

a coating applied to an edge of the die attach to at least inhibit dendrite formation or whisker growth of the die attach, wherein the coating and the die attach are formed from different materials, and the coating contacts a portion of the top surface of the substrate but does not contact the second surface of the die;

at least one wire extending from the second surface of the die to the substrate; and an enclosure coupled with the substrate to form a cavity within which the die is disposed, wherein the at least one wire does not contact the coating and is exposed to a gaseous environment within the cavity.

17. The system of claim 16, wherein the coating is an epoxy that is disposed around a complete periphery of the die attach.

18. The system of claim 16, wherein the coating is an epoxy that is disposed at a first portion of the edge of the die attach and a second portion of the edge of the die attach is exposed.

19. The system of claim 16, wherein the system is a radar device, a satellite communication device, a mobile handset, a base station, a broadcast radio, or a television amplifier system.

* * * * *